United States Patent [19]

Ohtsuka et al.

[11] Patent Number: 4,999,813
[45] Date of Patent: Mar. 12, 1991

[54] NONVOLATILE SEMICONDUCTOR MEMORY HAVING A STRESS TEST CIRCUIT

[75] Inventors: Nobuaki Ohtsuka; Junichi Miyamoto, both of Yokohama; Shigeru Atsumi, Tokyo, all of Japan

[73] Assignee: Kabushiki Kaisha Toshiba, Kawasaki, Japan

[21] Appl. No.: 341,287

[22] Filed: Apr. 20, 1989

Related U.S. Application Data

[63] Continuation-in-part of Ser. No. 261,863, Oct. 25, 1988, abandoned.

[30] Foreign Application Priority Data

Oct. 28, 1987 [JP] Japan .................................. 62-272119

[51] Int. Cl.5 ...................... G11C 29/00; G11C 16/04
[52] U.S. Cl. .................................... 365/201; 365/185; 365/189.06; 365/189.09; 365/204; 365/189.11
[58] Field of Search ........... 365/104, 184, 185, 189.06, 365/189.09, 201, 189.11, 204; 371/21.01, 21.4

[56] References Cited

U.S. PATENT DOCUMENTS

| | | | |
|---|---|---|---|
| 4,612,630 | 9/1986 | Rosier | 365/201 |
| 4,720,818 | 1/1988 | Takeguchi | 365/201 |
| 4,779,272 | 10/1988 | Kohda et al. | 365/201 |
| 4,819,212 | 4/1989 | Nakai et al. | 365/201 |

FOREIGN PATENT DOCUMENTS

| | | |
|---|---|---|
| 0231903 | 8/1987 | European Pat. Off. |
| 2581231 | 10/1986 | France |
| 61-61480 | 12/1986 | Japan |

OTHER PUBLICATIONS

Atsumi et al., "Fast Programmable 256K Read Only Memory With On-Chip Test Circuits", IEEE Journal of Solid State Circuits, vol. SC-20, No. 1, Feb. 1985, pp. 422–427.

*Primary Examiner*—Glenn Gossage
*Attorney, Agent, or Firm*—Finnegan, Henderson, Farabow, Garrett and Dunner

[57] ABSTRACT

In a nonvolatile semiconductor memory, a plurality of nonvolatile semiconductor memory cells are arranged in a matrix form. Each of the memory cells is connected to a corresponding one of a plurality of bit lines and to a corresponding one of a plurality of word lines. The ends of the bit lines are commonly connected to a programming transistor for setting a programming mode through transistors for selecting the bit lines. The transistors are connected to column decoders and the word lines are connected to a row decoder. Furthermore, the other ends of the bit lines are connected to a common connecting line through transistors for setting a test mode and the common connecting line is connected to a node between the test mode transistors and a series circuit of a transistor and a dummy memory cell in a clamp circuit. The transistor of the clamp circuit is connected to a high voltage and the series circuit is connected to the ground. In the test mode, the programming transistor and the bit line selecting transistors are turned off and the test mode transistors and the transistor connected to the clamp circuit are turned on. Thus, a test voltage is applied to the memory cells through the common connecting line, the test mode transistors and the bit lines.

12 Claims, 5 Drawing Sheets

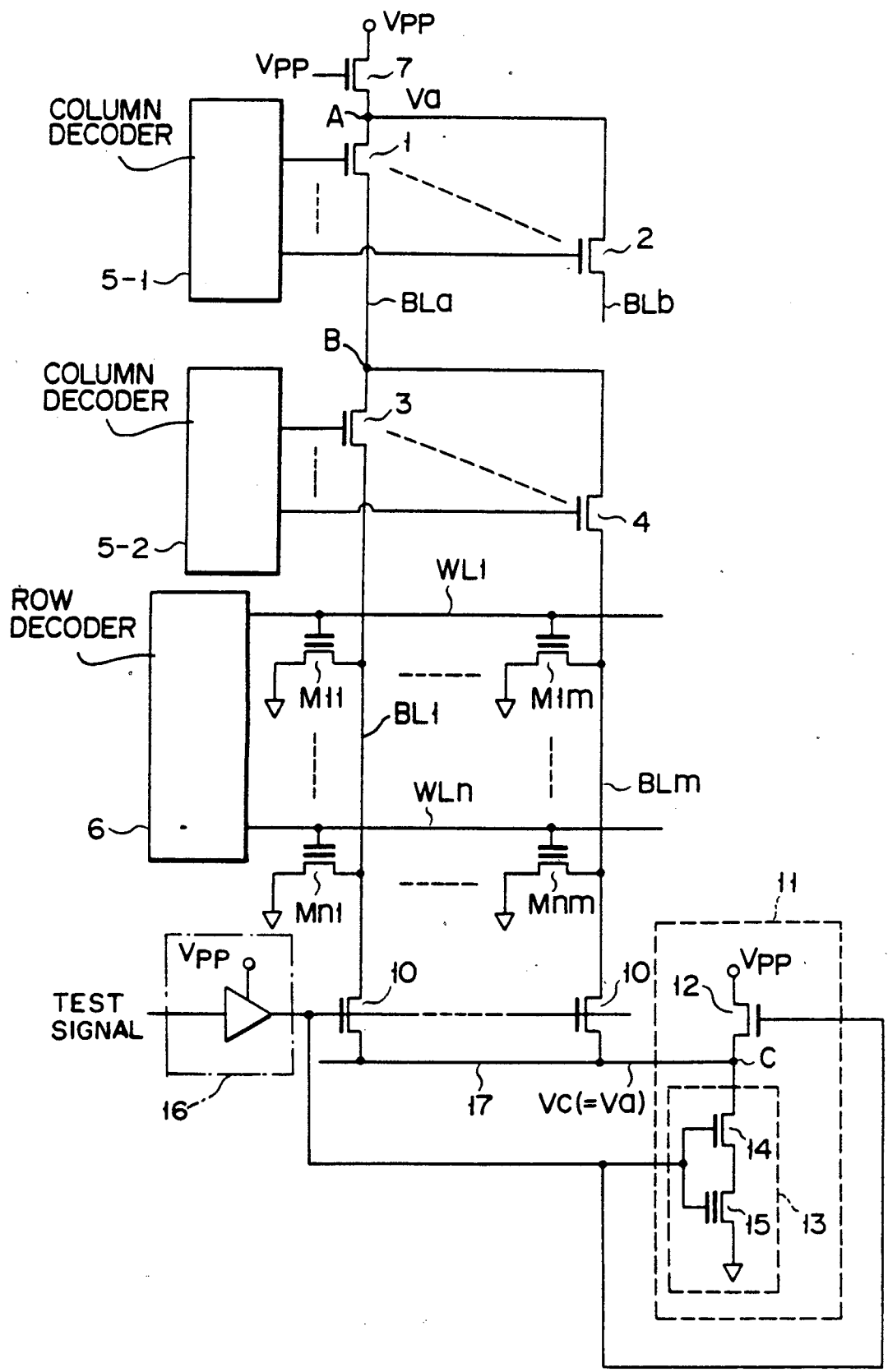
F I G. 4

NONVOLATILE SEMICONDUCTOR MEMORY HAVING A STRESS TEST CIRCUIT

This application is a continuation-in-part of application Ser. No. 07/261,863, filed Oct. 25, 1988, now abandoned.

BACKGROUND OF THE INVENTION

1. Field of the Invention

This invention relates to the improvement of a nonvolatile semiconductor memory, and more particularly to the improvement of a stress test circuit for effecting the stress test by applying a stress test voltage to memory cell transistors of a nonvolatile semiconductor memory.

2. Description of the Related Art

In general, memory cells of a nonvolatile semiconductor memory, for example, memory cells of an EPROM in which data can be erased by application of ultraviolet rays and data can be programmed again are each formed of a transistor having a control gate and a floating gate formed with the double layered structure on a semiconductor substrate. In such a semiconductor memory, the source of the memory cell transistor is kept at the ground potential and programming voltage Vpp of high voltage level is applied to the word line and the bit line respectively connected to the control gate and drain of the memory cell transistor in order to program data into the memory cell. In the memory cell to be programmed, a high voltage is applied to the drain thereof to set up a strong electric field in that portion of the channel region which lies near the drain. As a result, hot electrons are generated and then injected into the floating gate by an electric field set up by a high voltage applied to the control gate. The threshold voltage of a memory cell transistor in which electrons are injected into the floating gate becomes high in comparison with that of a memory cell transistor in which no electrons are injected into the floating gate, and in this way data can be programmed.

FIG. 1 shows an arrangement of part of the prior art EPROM. As shown in FIG. 1, common bit lines BLa to BLb are serially connected to transistors 1 to 2 for selecting the common bit lines, and each of common bit lines BLa to BLb is commonly connected to m bit lines or m column lines BL1 to BLm which are in turn connected in series with transistors 3 to 4 for selecting bit lines BL1 to BLm. Further, transistors 1 to 2 are commonly connected to programming power source voltage Vpp via programming transistor 7 which has a control signal VPGM applied to its gate. Memory cells (M11, ..., Mn1), (M1m, ..., Mnm) formed of floating gate type transistors are arranged in the matrix form, the drains thereof being connected to respective bit lines BL1 to BLm, the control gates thereof being connected to the respective word lines or row lines WL1 to WLn, and the sources thereof being connected to the ground lines (not shown).

Assume now that data is programmed into one of the memory cells (M11, ..., Mn1), (M1m, ..., Mnm), for example, memory cell M11 in the programming mode of the above semiconductor memory. In this case, word line WL1 is selected by row decoder 6 and is supplied with a high voltage. At the same time, transistor 7 is turned on and transistors 1 and 3 are respectively turned on by decoders 5-1 and 5-2 so as to select common bit line BLa. As a result, a high voltage serving as the programming voltage is supplied via selected bit line BLa. Thus, electrons are injected into the floating gate of the floating gate type transistor constituting memory cell M11, thereby programming data into memory cell M11.

In a case where data is written or programmed into memory cell M11, (n−1) memory cells M21 to Mn1 except memory cell M11 are all kept in the nonselective condition. At this time, the control gates of the transistors constituting memory cells M21 to Mn1 are kept at the ground potential, and a high voltage is applied as electrical stress to the drains of the transistors constituting memory cells M21 to Mn1. If there is any deficiency in the data storing and holding function of the transistors constituting memory cells M21 to Mn1, for example, if a transistor in which data has been programmed has an excessively thin or defective gate insulation film, then electrons are emitted from the floating gate of the transistor when the high programming voltage is applied as the electrical stress to the drain of the transistor, thus causing the stored data to be erased.

In general, in the above semiconductor memory, a test for reliability or stress test is effected to check the data holding characteristics of semiconductor memory cells (M11, ..., Mn1), (M1m, ..., Mnm). In the stress test, after data is programmed into all the semiconductor memory cells (M11, ..., Mn1), (M1m, ..., Mnm), word lines WL1 to WLn are kept in the non-selection state, and bit lines BL1 to BLm are selected and set to a high programming voltage. After this, data is read out from each of semiconductor memory cells (M11, ..., Mn1), (M1m, ...; Mnm) and a memory cell or memory cells having defective stored data holding function are detected based on the readout data. During the stress test, a high programming voltage is sequentially applied to the bit lines to read out data from the memory cells in the memory having column decoders 5-1 and 5-2 to which N-bit address is supplied. Therefore, it takes a long time for the stress test.

A stress test method for reducing the test period is proposed in which all the bit lines BL1 to BLm are selected by column decoders 5-1 and 5-2 and a high programming voltage is applied to all the bit lines BL1 to BLm while word lines WL1 to WLn are kept in the non-selection state in the test mode. In the stress test method, high voltage Vpp is applied to turn on transistor 7 as shown in FIG. 2. At the same time, high voltage Vpp is generated from column decoders 5-1 and 5-2 to turn on transistors 1, 3 and 7, thus selecting bit lines BL1 to BLm. Further, clamp circuit 8 which is connected to connection node A between transistor 7 and bit lines BL1 to BLm and is used to set connection node A to a programming voltage is operated so as to cause a test voltage of the same level as the programming voltage to be applied to the drains of those semiconductor memory cells (M11, ..., Mn1), (M1m, ..., Mnm) which are kept in the non-selected state. After the test voltage is applied, data recording states of memory cells (M11, ..., Mn1), (M1m, ..., Mnm) are checked.

According to the above test method, the test voltage can be efficiently applied to memory cells (M11, ..., Mn1), (M1m, ..., Mnm). However, it has the following problem. That is, as shown in FIG. 3, if there is defective portion 9 causing current to leak between a bit line, for example, bit line BLm and the ground line, or if the bit line is defective, a transistor constituting the memory cell is defective, or defective contact occurs between the bit line and the word line, then a current leak path of connection node A, transistor 1, connection node B, transistor 4 and defective portion 9 is formed. As a result, potential at connection node B is lowered and potential at connection node A is also lowered. Therefore, it becomes impossible to apply a test voltage of the same level as the programming voltage to memory cells (Mll, . . . , Mnl), (Mlm, . . . , Mnm). In this case, it is only possible to apply a voltage lower than the test voltage, and a satisfactory test cannot be effected. If it is only possible to apply a voltage lower than the test voltage to memory cells (Mll, . . . , Mnl), (Mlm, . . . , Mnm), memories having a defective stored data holding function cannot be correctly detected in the stress test even if they are included in the memory cells (Mll, . . . , Mnl), (Mlm, . . . , Mnm).

The bit line in which defective portion 9 tends to occur is detected in the test operation other than the stress test, and can be compensated for by use of a redundancy circuit. However, the stress test is influenced by the bit line having defective portion 9, making it impossible to detect the defective memory cells. Therefore, there is a possibility that the semiconductor memory including the defective memory cells is sold on the market.

SUMMARY OF THE INVENTION

An object of this invention is to provide a semiconductor memory having a circuit for checking the storage data holding function.

According to this invention, there is provided a nonvolatile semiconductor memory which comprises:

a plurality of bit lines each having one end and the other end;

a plurality of word lines;

nonvolatile semiconductor memory cells arranged in a matrix form and respectively connected to corresponding ones of said bit lines and word lines;

means for selecting said bit lines and word lines;

a first transistor connected to one end of said bit lines to set the semiconductor memory to a data programming mode, said first transistor being turned in the programming mode;

a plurality of second transistors connected to the other end of said bit lines to set the test mode in which said first transistor is turned off and said second transistors are turned on, each of said second transistors having a mutual conductance smaller than that of said first transistor;

a common connecting line connected to said bit lines via said second transistors; and means connected to said common connecting line to apply the stress voltage to said bit lines in the test mode.

BRIEF DESCRIPTION OF THE DRAWINGS

FIG. 4 shows the circuit construction of a semiconductor memory according to one embodiment of this invention;

DETAILED DESCRIPTION OF THE PREFERRED EMBODIMENTS

FIG. 4 is a circuit diagram showing an EPROM or semiconductor memory according to one embodiment of this invention. Like the conventional semiconductor memory, the EPROM includes memory cells (Mll, . . . , Mnl), (Mlm, . . . , Mnm) formed of floating gate type transistors arranged in a matrix form. The gates of the transistors are connected to corresponding word lines WLl to WLn, the drains thereof are connected to corresponding bit lines BLl to BLm, and the sources thereof are connected to the ground line. Bit lines BLl to BLm are connected at common connection node B to common connecting line BLa via respective bit line selection transistors. Common connecting line BLa is connected to common connection node A via common connecting line selection MOS transistor 1. Common connection node A is connected to high programming voltage terminal Vpp via MOS transistor 7. Further, common connection node A is connected to common bit line BLb via respective MOS transistors 2 for selecting common bit lines BLb, and common bit lines BLb are each connected to a corresponding one of the same common connection nodes (not shown) as common connection node B. The common connection node is connected to bit lines (not shown) via the same transistors (not shown) as MOS transistors 3 to 4 for selecting the bit lines. The bit lines and word lines WLl to WLn are connected to the same memory cells as memory cells (Mll, . . . , Mnl), (Mlm, . . . , Mnm).

Figure 1:
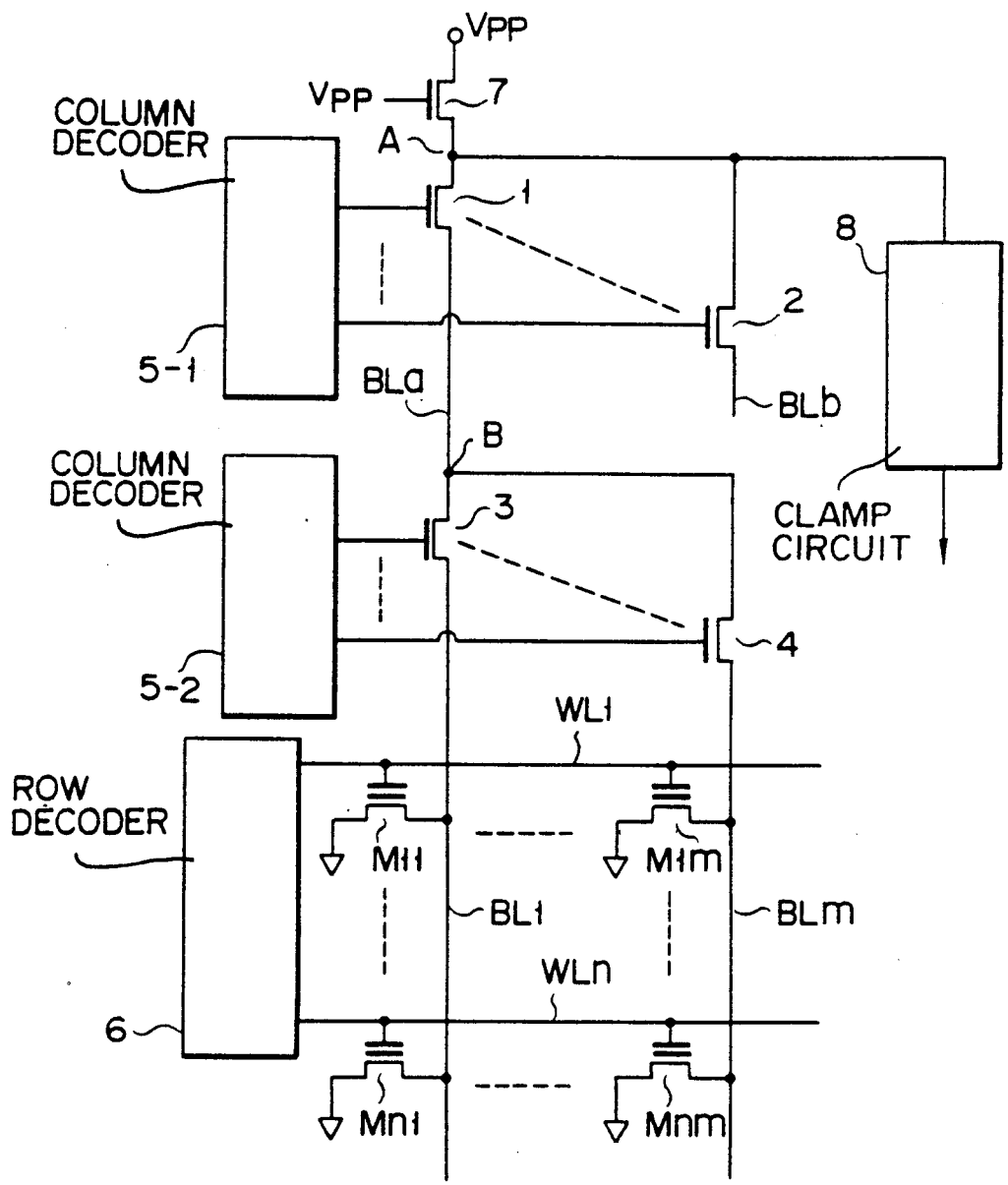
FIG. 1 shows part of a circuit construction of the conventional semiconductor memory.
Figure 2:
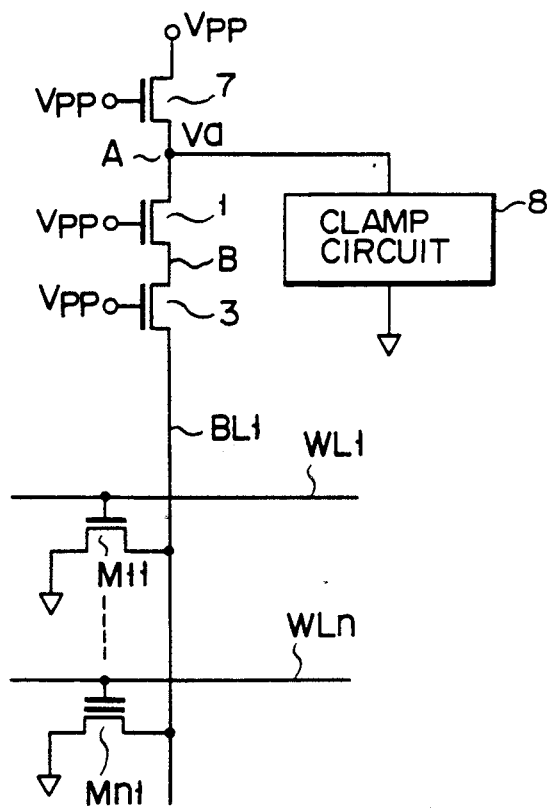
FIG. 2 shows the circuit construction of a bit line included in the semiconductor memory circuit of FIG. 1 set in the stress test mode.
Figure 3:
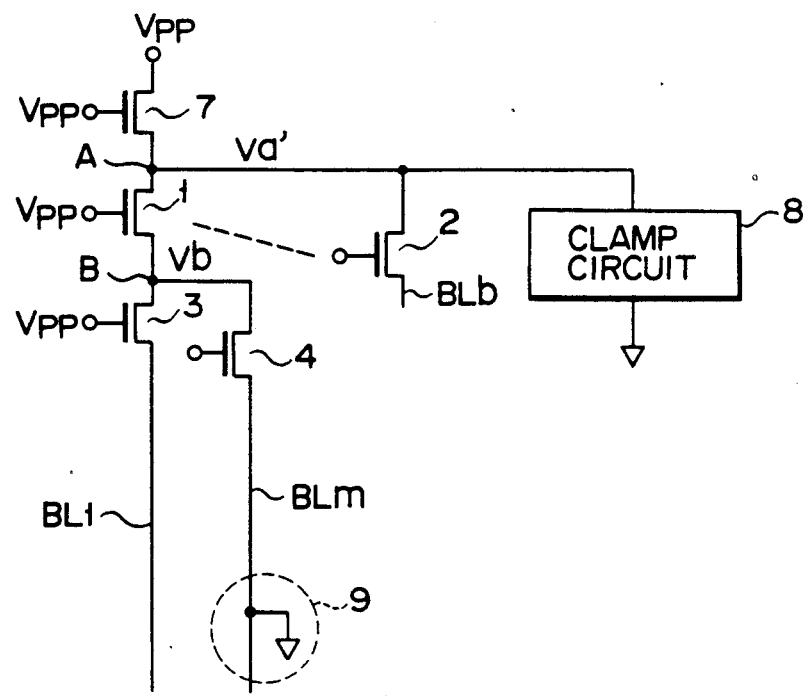
FIG. 3 shows the circuit constructions of a defective bit line and a bit line included in the semiconductor memory circuit of FIG. 1 set in the stress test mode.
Figure 5:
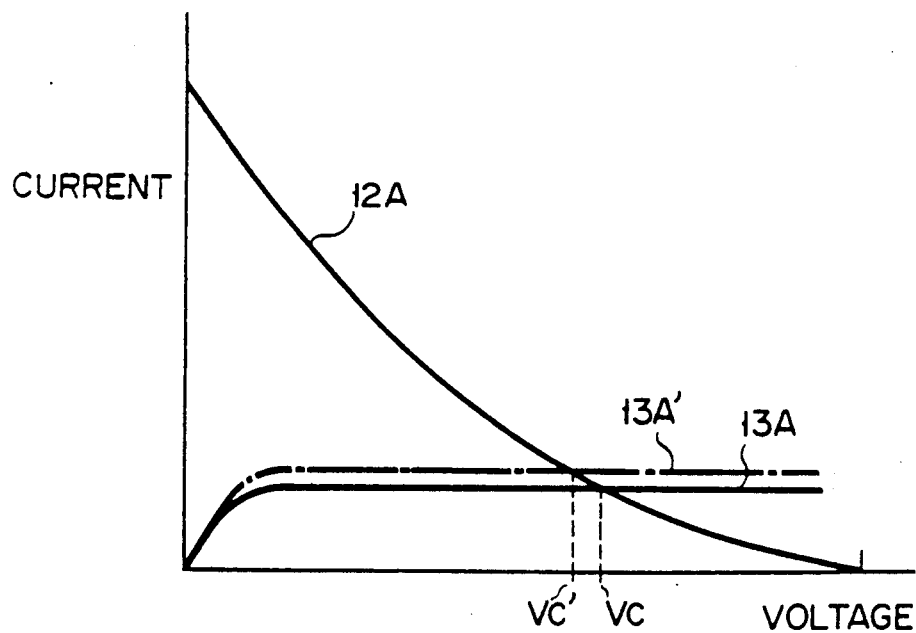
FIG. 5 is a graph showing the characteristics of a circuit of FIG. 4 for applying a stress voltage supplying circuit.

In the embodiment of this invention, bit lines BLl to BLm are connected to common connection line 17 via MOS transistors 10 whose gates are connected to test mode signal source (not shown). Common connection line 17 is connected to stress voltage application circuit 11. MOS transistors 10 are constituted to have an extremely small mutual conductance gm in comparison with that of MOS transistors 1 to 4. That is, MOS transistors 10 are formed to have extremely small ratio W/L of channel width W to channel length L so that the internal resistance of the MOS transistors in the conductive state can be set to be larger than that of MOS transistors 1 to 4. In stress voltage application circuit 11, common connecting line 17 is connected to common connection node C of the stress voltage application circuit, and common connection node C is connected to programming voltage terminal Vpp via MOS transistor 12 and grounded via clamp circuit or test voltage setting circuit 13. Further, as shown in FIG. 4, clamp circuit 13 is constituted by a circuit which includes MOS transistor 14 and dummy memory cell 15 connected in series with MOS transistor 14. Dummy memory cell 15 is formed of a floating gate type transistor which is the same as memory cells (Mll, . . . , Mnl), (Mlm, . . . , Mnm) and is formed in the same manufacturing step as memory cells (Mll, . . . , Mnl), (Mlm, . . . , Mnm). The gates of MOS transistors 10, 12, 14 and dummy memory cell 15 are connected, via potential conversion circuit 16, to a test mode signal source (not shown) for converting test mode signal Vcc of normal logic level into test mode signal Vpp of a high voltage level equal to that of the programming signal. In stress test circuit 11, transistor 12 and clamp circuit 13 are so designated that a voltage at common connection node C between transistor 12 and clamp circuit 13 can be set to stress voltage Vc in the stress test mode. As shown in FIG. 5, stress voltage Vc is determined by the load characteristic of transistor 12 and current characteristic 13A to clamp circuit 13.

In the above semiconductor memory, the semiconductor memory is set into the programming mode before the stress test is started, and data is programmed into a group of memory cells (Mll, ..., Mnl), (Mlm, ..., Mnm) corresponding to one byte or several bytes. In the programming mode, MOS transistor 10 is kept in the nonconductive state, and programming voltage Vpp is applied to the gate of MOS transistor 7 to turn on the same. At the same time, high voltage Vpp is applied from column decoders 5-1 and 5-2 to the gates of MOS transistors 1 to 4 to turn on the same, thus selecting all the bit lines BLl to BLm. When all the bit lines BLl to BLm are thus selected, high voltage Vpp is supplied from row decoder 6 to select one of or several of word lines WLl to WLn. As a result, high voltage Vpp is applied to the drains and gates of the selected group of memory cells (Mll, ..., Mnl), (Mlm, ..., Mnm) connected to bit lines BLl to BLm and selected word line or lines WLl to WLn, and data is programmed into the selected group of the memory cells (Mll, ..., Mnl), (Mlm, ..., Mnm) corresponding to one byte or several bytes. The other groups of memory cells (Mll, ..., Mnl), (Mlm, ..., Mnm) are also programmed in a same manner as described above. Thus, all the memory cells are programmed. Under this condition, the semiconductor memory is set into the test mode and tested.

Unlike the programming mode, in the test mode, the gate of MOS transistor 7 is kept at the ground potential and MOS transistor 7 is kept in the non-conductive state. Further, the gates of MOS transistors 1 to 4 are kept at the ground potential by means of column decoders 5-1 and 5-2, and MOS transistors 1 to 4 are kept in the non-conductive state, thus keeping all the bit lines BLl to BLm in the nonselection state. At this time, word lines WLl to WLn are also kept in the nonselection state. Under this condition, the test mode signal is converted into a high voltage test signal of high voltage Vpp by potential converter circuit 16, and this converted signal is supplied to transistor 10 to turn on the same. The high voltage test signal is also supplied to transistors 12 and 14 and dummy memory cell 15. Therefore, transistors 12 and 14 are turned on and high voltage Vpp is applied to the gate and drain of dummy memory cell 15 so as to set dummy memory cell 15 into the same condition as the data programming condition in which data is programmed into one of memory cells (Mll, ..., Mnl), (Mlm, ..., Mnm). As a result, test voltage Vc which is shown in FIG. 5 and is set at the same level as programming voltage Va appearing at connection nodes A or B when data is programmed into one of memory cells (Mll, ..., Mnl), (Mlm, ..., Mnm) is developed at connection node C. Since transistors 10 are turned on and none of the word lines WLl to WLn are selected to keep all the memory cells (Mll, ..., Mnl), (Mlm, ..., Mnm) in the nonconductive state, the test voltage or stress voltage is applied to all the bit lines BLl to BLm as it is. In this way, the test voltage or stress voltage is applied to the drains of all the memory cells (Mll, ..., Mnl), (Mlm, ..., Mnm).

Figure 6:
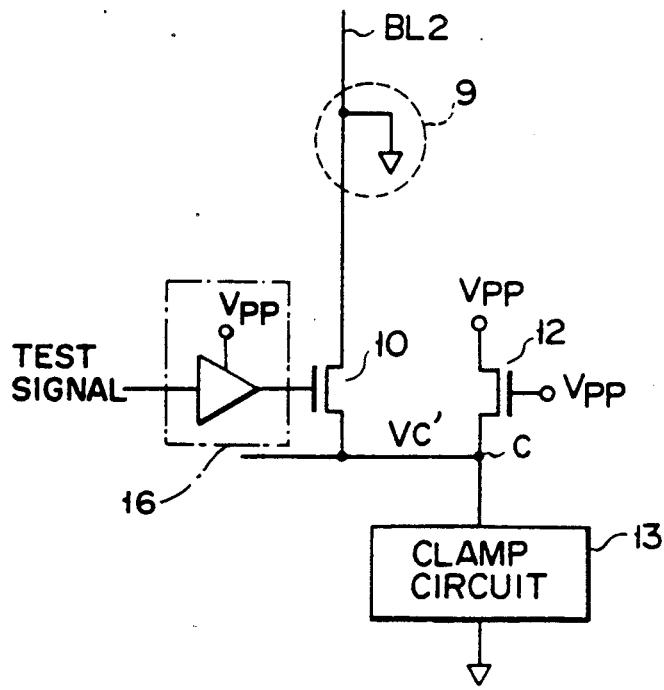
FIG. 6 shows the circuit construction of a bit line including a defective portion in the circuit of FIG. 4.

In the semiconductor memory shown in FIG. 4, since all the memory cells (Mll, ..., Mnl), (Mlm, ..., Mnm) are kept in the nonconductive state, no discharging path is formed in the memory cell arrangement including memory cells (Mll, ..., Mnl), (Mlm, ..., Mnm) if bit lines BLl to BLm have no defects or memory cells (Mll, ..., Mnl), (Mlm, ..., Nmn) have no defects. Therefore, even if the internal resistance of transistor 10 is not large, the stress voltage at connection node C can be applied to bit lines BLl to BLm as it is. In contrast, if bit lines BLl to BLm have the defect or memory cells (Mll, ..., Mnl), (Mlm, ..., Mmn) have the defect as shown in FIG. 6 to form current leak path 9 for bit lines BLl to BLm, a discharging path is formed in the memory cell arrangement including bit lines BLm and memory cells (Mll, ..., Mnl), (Mlm, ..., Mnm) to permit a current to flow via current leak path 9, lowering the bit line voltage of the bit line in which current leak path 9 is formed. However, since the internal resistance of transistor 10 is extremely larger than that of clamp circuit 13, current characteristic 13A' of clamp circuit 13 is shifted only a small amount with respect to ordinary current characteristic 13A, and the voltage drop at common connection node C due to the current leak can be suppressed to a sufficiently small value. That is, potential Vc at common connection node C is only slightly lowered and set to potential Vc' as shown in FIG. 5. As a result, voltage Vc' set at a sufficiently high voltage level as the stress voltage is applied to bit lines BLl to BLm except for the bit line in which current leak path 9 is formed, and consequently voltage Vc' set at a sufficiently high voltage level as the stress voltage is applied to the drain of memory cells (Mll, ..., Mnl), (Mlm, ..., Mnm).

After the stress voltage is applied to memory cells (Mll, ..., Mnl), (Mlm, ..., Mnm), the stress test signal disappears and transistors 10, 12 and 14 are turned off. Then, data stored in memory cells (Mll, ..., Mnl), (Mlm, ..., Mnm) is read out in the ordinary readout mode, and the storage holding function of memory cells (Mll, ..., Mnl), (Mlm, ..., Nmn) is checked based on the readout data.

Figure 7:
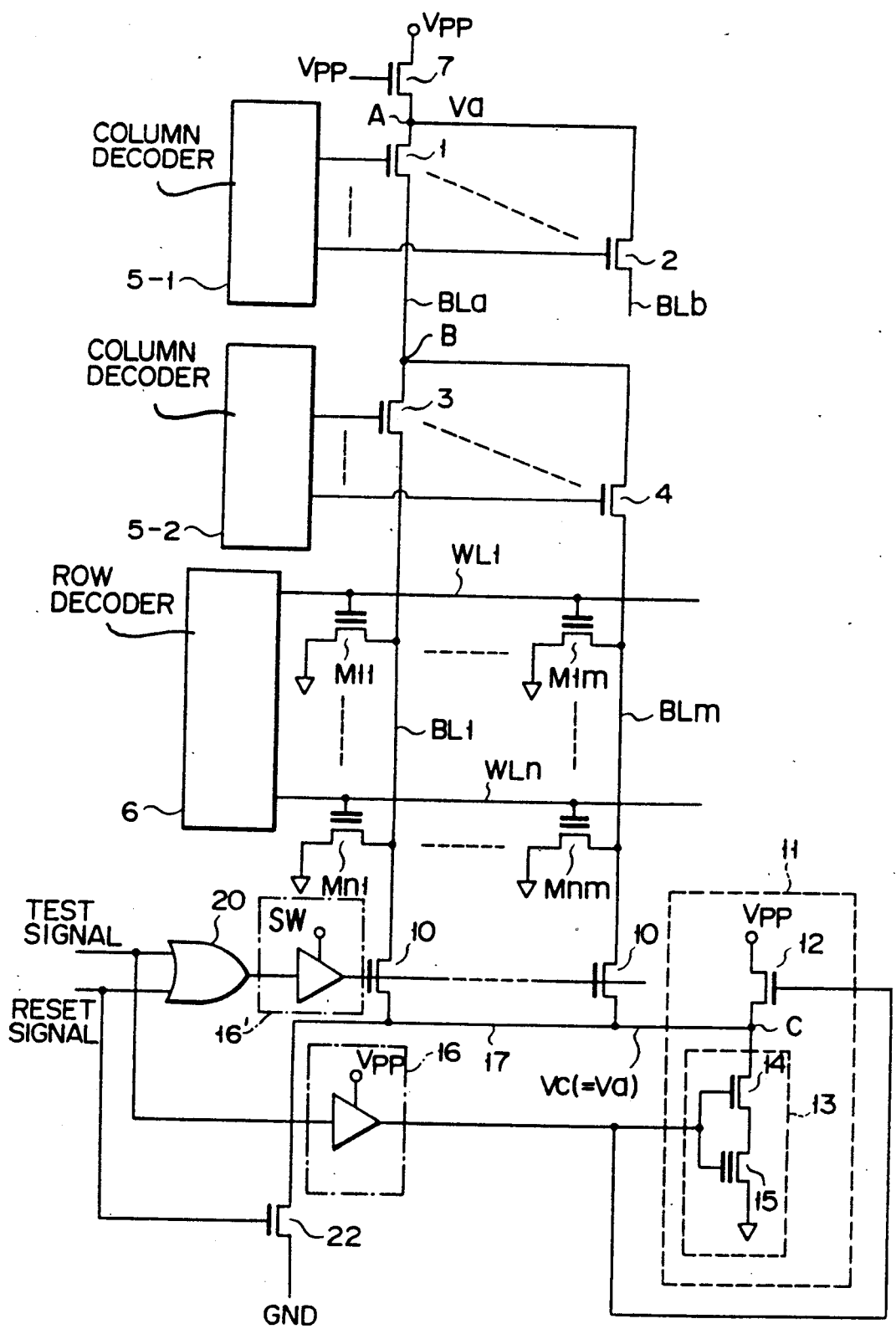
FIG. 7 shows the circuit construction of a semiconductor memory according to another embodiment of this invention.

FIG. 7 shows a semiconductor memory device according to another embodiment of this invention. In FIG. 7, portions which are the same as those of the above embodiment are denoted by the same reference numerals and the explanation thereof is omitted. In the semiconductor memory of FIG. 7, transistors 10 have a function of resetting the bit lines when the operation mode is changed from the programming mode to the verify mode in addition to the function of setting the memory into the test mode. When the test signal is input in the test mode, the test signal is supplied to transistors 10 via OR circuit 20 after it is converted into high voltage signal by means of the potential converter circuit 16'. SW is an internal supply voltage whose level is equal to the Vpp level during the programming mode and equal to the Vcc level during the reading mode. At the same time, the test signal is supplied to transistors 12 and 14 and dummy memory cell 15 after it is converted into a high voltage test signal by means of the potential converting circuit 16. As a result, transistors 10, 12 and 14 are turned on to set the memory into the test mode as described before. When it is changed from the programming mode to the verify mode, a reset signal is input to OR circuit 20 to turn on transistors 10, and MOS transistor 22 connected to common connecting line 17 is turned on. Therefore, common connecting line 17 is grounded via MOS transistor 22, and consequently bit lines BL1 to BLm set at a high potential in the programming mode are grounded via transistors 10, common connecting line 17 and MOS transistor 22. In this way, bit lines BL1 to BLm are reset to the ground potential for the next verify mode. In the prior art semiconductor memory, transistors 10 are provided for resetting the bit lines, and if transistors 10 are also used as transistors for setting the test mode, the circuit construction can be simplified. Further, the semiconductor memory can be formed to have a test function without changing the light exposure pattern for forming the semiconductor memory.

It is possible to provide a plurality of programming transistors 7 according to the number of columns of the EPROM. In this case, however, it was necessary in the prior art to provide a plurality of stress voltage clamp circuits 8 of FIG. 5 corresponding in number to transistors 7. In contrast, according to the stress test circuit of this invention, it is possible to use a single stress voltage application circuit 11 commonly for all the columns irrespective of the number of programming transistors 7.

As described above, according to the stress test circuit of the nonvolatile semiconductor memory of this invention, even if defective bit lines having defective or leak portions are present, normal stress voltage can be applied to normal bit lines, thus making it possible to check the reliability or data holding characteristic of the memory cell.

What is claimed is:

1. A nonvolatile semiconductor memory comprising:
   a plurality of bit lines each having a first end an a second end;
   a plurality of word lines;
   nonvolatile semiconductor memory cells arranged in a matrix form and respectively connected to corresponding ones of said bit lines and word lines;
   means for selecting one of said bit lines and one of said word lines;
   a first transistor coupled to the first end of each of said bit lines, said first transistor being turned on in a data programming mode of the semiconductor memory;
   a plurality of second transistors respectively connected between the second ends of the bit lines and a common connecting line, said first transistor being turned off and said second transistors being turned on in a test mode of the semiconductor memory, each of said second transistors having a mutual conductance smaller than that of said first transistor; and
   means connected to said common connecting line for applying a stress voltage to said bit lines in the test mode.

2. A nonvolatile semiconductor memory according to claim 1, further comprising switching means connected between said common connecting line and a ground potential, said switching means being turned on in response to a reset signal, and wherein said second transistors are turned on in response to the reset signal, and said bit lines are grounded via said second transistors, said common connecting line and said switching means, and thus are reset.

3. A nonvolatile semiconductor memory according to claim 1, wherein a programming voltage is applied to said bit lines via said first transistor in the programming mode.

4. A nonvolatile semiconductor memory according to claim 3, wherein said means for applying the stress voltage to said common connecting line includes stress voltage application means for converting the programming voltage into a stress voltage and then applying the stress voltage to said common connecting line in the test mode.

5. A nonvolatile semiconductor memory according to claim 3, wherein
   said stress voltage application means includes a third transistor which is connected to receive the programming voltage and is turned on in the test mode, a fourth transistor which is connected in series with said third transistor and which is turned on in the test mode, and a dummy memory cell having substantially the same construction as one of said memory cells, connected between said fourth transistor, and a ground potential; and
   said common connecting line is connected to a connection node between said third and fourth transistors.

6. A nonvolatile semiconductor memory according to claim 4, further comprising switching means connected between said common connecting line and a ground potential, said switching means being turned on in response to a reset signal, and wherein said second transistors are turned on in response to the reset signal, and said bit lines are grounded via said second transistors, said common connecting line and said switching means, and thus are reset.

7. A nonvolatile semiconductor memory according to claim 6, further comprising:
   first converting means for converting a test signal into a first high voltage test signal of a high voltage level; and
   second converting means for converting the test signal into a second high voltage test signal of the high voltage level
   wherein said stress voltage application means is energized in response to the first high voltage test signal, and said second transistors are turned on in response to the second high voltage test signal or the reset signal.

8. A nonvolatile semiconductor memory according to claim 7, wherein the voltage level of said first high voltage test signal is the programming voltage.

9. A nonvolatile semiconductor memory according to claim 4, wherein said second transistors are turned on in response to a test signal in the test mode.

10. A nonvolatile semiconductor memory according to claim 9, which further comprises converting means for converting the test signal into a high voltage test signal of a high voltage level and in which said stress voltage application means is energized and said second transistors are turned on in response to the high voltage test signal.

11. A nonvolatile semiconductor memory according to claim 10, wherein
   said stress voltage application means includes a third transistor which is connected to receive the programming voltage and is turned on in the test mode, a fourth transistor which is connected in series with said third transistor and which is turned on in the test mode, and a dummy memory cell having substantially the same construction as one of said memory cells, connected between said fourth transistor and a ground potential; and
   said common connecting line is connected to a connection node between said third and fourth transistors.

12. A nonvolatile semiconductor memory according to claim 10, wherein the high voltage level of said high voltage test signal is the programming voltage.

* * * * *